(12) United States Patent
Chang et al.

(10) Patent No.: US 7,539,913 B2
(45) Date of Patent: May 26, 2009

(54) SYSTEMS AND METHODS FOR CHIP TESTING

(75) Inventors: Chien-Cheng Chang, Taipei (TW); Cheng-Yuan Wu, Taipei (TW)

(73) Assignee: Via Technologies, Inc., Taipei (TW)

( * ) Notice: Subject to any disclaimer, the term of this patent is extended or adjusted under 35 U.S.C. 154(b) by 429 days.

(21) Appl. No.: 11/428,585

(22) Filed: Jul. 5, 2006

(65) Prior Publication Data

US 2008/0022168 A1    Jan. 24, 2008

(51) Int. Cl.
    *G01R 31/28* (2006.01)
(52) U.S. Cl. .......................... 714/724; 714/25; 714/30; 714/725; 714/726; 714/730; 714/734; 714/742; 326/16
(58) Field of Classification Search .................. None
    See application file for complete search history.

(56) References Cited

U.S. PATENT DOCUMENTS 4,860,290 A * 8/1989 Daniels et al. .............. 714/726
5,517,515 A * 5/1996 Spall et al. .................. 714/733
5,936,976 A * 8/1999 Story et al. .................. 714/724
2003/0164718 A1* 9/2003 Emberling et al. ............ 326/16

* cited by examiner

*Primary Examiner*—John P Trimmings
(74) *Attorney, Agent, or Firm*—Thomas, Kayden, Horstemeyer & Risley

(57) ABSTRACT

Circuit and method for testing digital logic circuit modules of an integrated circuit chip. The circuit includes a storage device, a first multiplexing module and a selection device. The storage device stores first, second, third and fourth N-bit groups of a test pattern separately according to a loading signal and an address selection signal. The first multiplexing module is coupled to the storage device and a first digital logic circuit module, for parallel transmitting the first, second, third and fourth N-bit groups which will be received and executed by the first digital logic circuit module to parallel generate first, second and third M-bit groups. The selection device is coupled to the first digital logic circuit module for sequentially selecting one of the first, second and third M-bit groups to output a first test result according to the address selection signal.

26 Claims, 8 Drawing Sheets

| Cycle | Test Data In(TDI) | | | | Expected Test Data Out(TDO) | | |
|---|---|---|---|---|---|---|---|
| | TDI[0] | TDI[1] | TDI[2] | TDI[3] | TDO[0] | TDO[1] | TDO[2] |
| 0 | 0001 | 1111 | 1000 | 1100 | 1010 | 1100 | 0011 |
| 1 | 0111 | 1111 | 1000 | 0011 | 0011 | 1100 | 0100 |
| 2 | ...... | | | | | | |

FIG. 5

SYSTEMS AND METHODS FOR CHIP TESTING

BACKGROUND OF THE INVENTION

1. Field of the Invention

The invention relates to chip testing, and in particular to circuits and methods for testing digital logic circuit modules of an integrated circuit chip.

2. Description of the Related Art

As semiconductor techniques advance, gate counts in a chip increase rapidly. However, pins provided in a chip to test whether the integrated circuits function normally are not sufficient. Various methods and circuits have been proposed to resolve the problems of insufficient test pins.

FIG. 1 is a block diagram of a conventional boundary scan method for testing a chip. As shown, a boundary scan method is used to test modules 102, 104, 106 and 108 with several boundary scan cells 110 arranged therearound.

A conventional boundary scan method provides testing of interconnects between integrated circuits on a board without using physical test probes. It adds a boundary-scan cell, including a multiplexer and latches, to each pin on the device. Boundary-scan cells in a device can capture data from pin or core logic signals, or force data onto pins. Captured data is serially shifted out and externally compared to the expected results. Forced test data is serially shifted into the boundary-scan cells. Control is provided by a serial data path, referred to as the scan path or scan chain.

In FIG. 1, six boundary scan cells are arranged around each module. The boundary scan cells are connected in series, and receive each pattern serially. When all boundary scan cells have received test patterns, the test patterns are further sent to all modules in parallel. The test results of the modules are received in parallel. The test results are then output one by one in series.

The function of the chip module can be tested by this boundary scan method. However, as the test patterns required for all modules are received or output in series, time consumption of this operation is significant.

Moreover, the test patterns generated and modified for testing the chip must be changed when the modules of the chip change.

BRIEF SUMMARY OF THE INVENTION

A detailed description is given in the following embodiments with reference to the accompanying drawings.

Embodiments of a circuit for testing digital logic circuit modules of an integrated circuit chip comprise a storage device, a first multiplexing module and a selection device. The storage device stores a first N-bit group, a second N-bit group, a third N-bit group and a fourth N-bit group of a test pattern separately according to a loading signal and an address selection signal. The first multiplexing module is coupled to the storage device and a first digital logic circuit module, parallel transmits the first N-bit group, the second N-bit group, the third N-bit group and the fourth N-bit group which will be received and executed by the first digital logic circuit module to parallel generate a first M-bit group, a second M-bit group and a third M-bit group. The selection device is coupled to the first digital logic circuit module, sequentially selects one of the first M-bit group, the second M-bit group and the third M-bit group to output a first test result according to the address selection signal, wherein each one of the first N-bit group, the second N-bit group, the third N-bit group and the fourth N-bit group of the test pattern has N bits and each one of the first M-bit group, the second M-bit group and the third M-bit group has M bits.

The invention provides another embodiment of a circuit includes a second multiplexing module coupled to the storage device, the first digital logic circuit module, a second logic circuit module and the selection device, for parallel transmitting the first M-bit group, the second M-bit group, and the third M-bit group which will be received and executed by the second digital logic circuit module to parallel generate a next first M-bit group and a next second M-bit group.

The invention also provides a method for testing digital logic circuit modules of an integrated circuit chip, the method comprising storing a first N-bit group, a second N-bit group, a third N-bit group and a fourth N-bit group of a test pattern separately according to a loading signal and an address selection signal, parallel transmitting the first N-bit group, the second N-bit group, the third N-bit group and the fourth N-bit group which will be received and executed to parallel generate a first M-bit group, a second M-bit group and a third M-bit group, and sequentially selecting one of the first M-bit group, the second M-bit group and the third M-bit group to output a first test result according to the address selection signal. Each one of the first N-bit group, the second N-bit group, the third N-bit group and the fourth N-bit group of the test pattern has N bits and each one of the first M-bit group, the second M-bit group and the third M-bit group has M bits.

The method further includes generating a first enabling signal, a second enabling signal, a third enabling signal and a fourth enabling signal separately in response to the loading signal and the address selection signal, and storing the first N-bit group, thr second N-bit group, the third N-bit group and the fourth N-bit group separately corresponding to the first enabling signal, the second enabling signal, the third enabling signal and the fourth enabling signal respectively.

BRIEF DESCRIPTION OF THE DRAWINGS

The invention can be more fully understood by reading the subsequent detailed description and examples with references made to the accompanying drawings, wherein:

FIG. 5 shows an example of a test pattern;

DETAILED DESCRIPTION OF THE INVENTION

The following description is of the best-contemplated mode of carrying out. the invention. This description is made for the purpose of illustrating the general principles of the invention and should not be taken in a limiting sense. The scope of the invention is best determined by reference to the appended claims.

Figure 1:
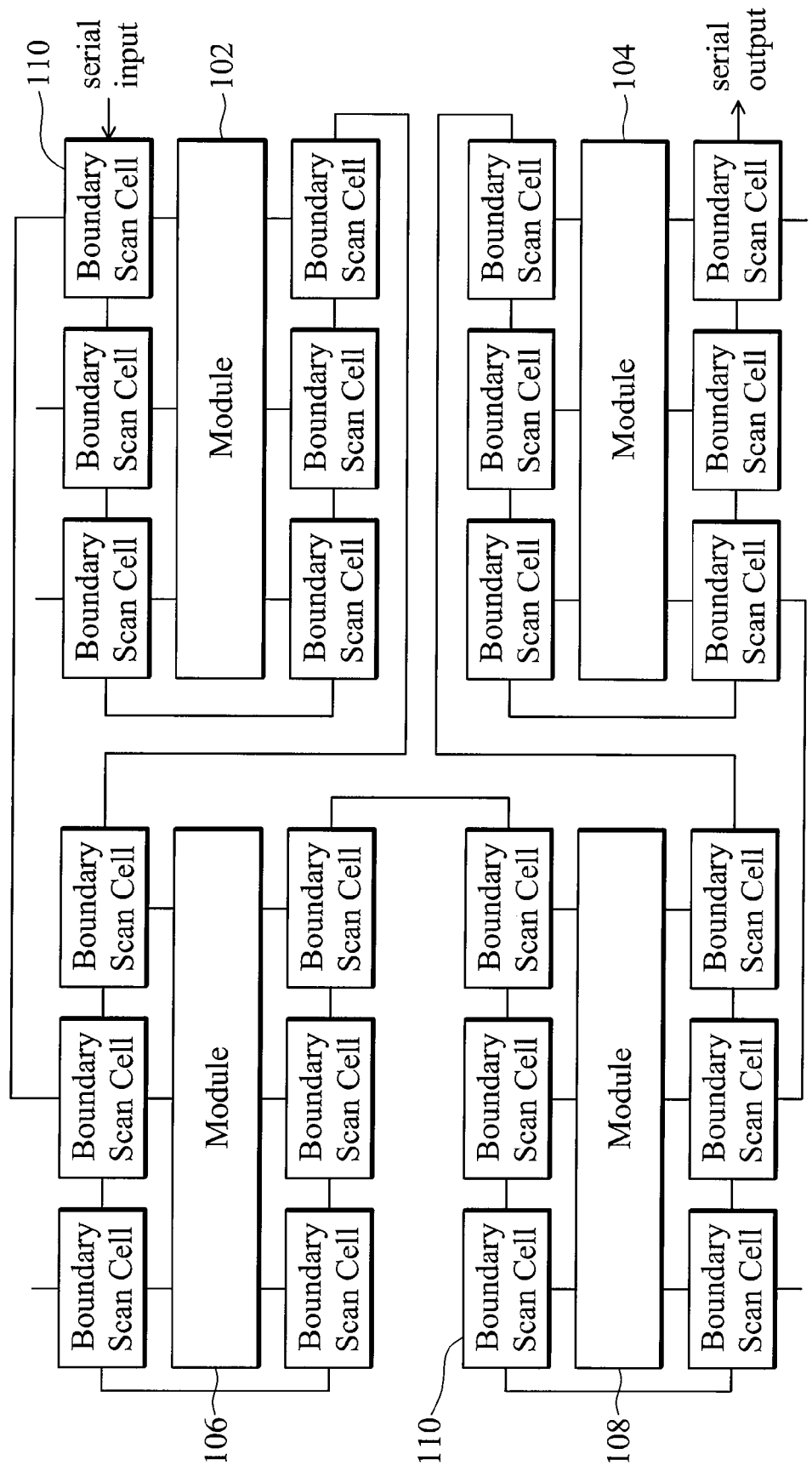
FIG. 1 is a block diagram of a conventional boundary scan method for testing a chip.
Figure 2:
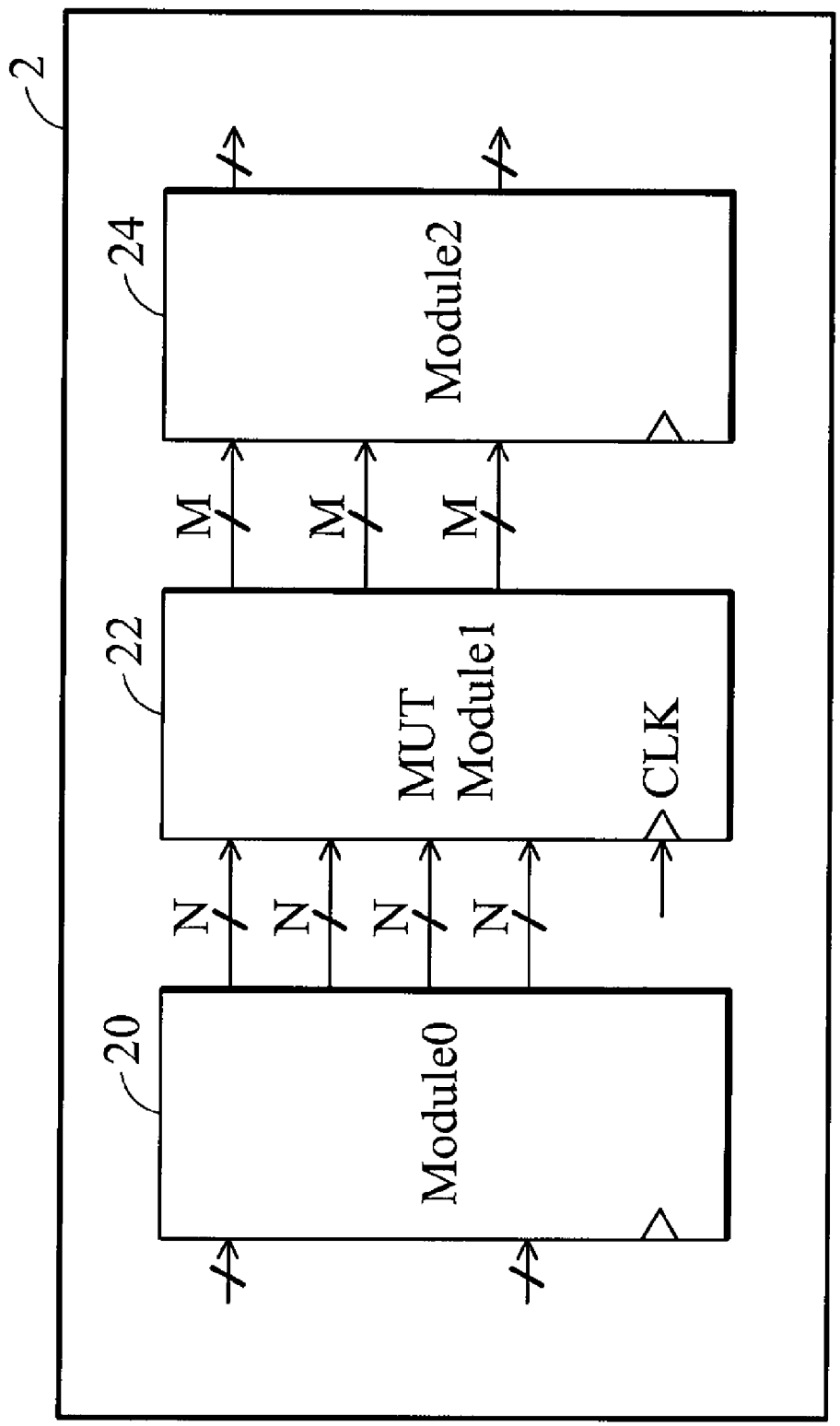
FIG. 2 is a block diagram of a chip comprising a testing module.

FIG. 2 schematically shows an embodiment of an integrated circuit chip (chip) 2 undergoing testing, comprising three modules Module0 20, Module1 22 and Module2 24, of which the Module1 22 is undergoing testing, hereafter referred to as testing Module MUT. Note that three modules Module0 20, Module1 22 and Module2 24 can be digital logic circuit modules. The testing Module MUT receives 4*N bits input data from the Module0 20 and outputs 3*M bits data to the Module2 24 in response to a clock signal. The N and M are positive integers and are related to the input pins and output pins of the testing Module MUT. Note that three modules Module0 20, Module1 22 and Module2 24 are connected in parallel. For example, N is 4 and M is 3 when testing Module MUT has 4 input pins and 3 output pins. The chip 2 may be a system on chip used in an electronic device, communication, or network, for example.

Figure 3:
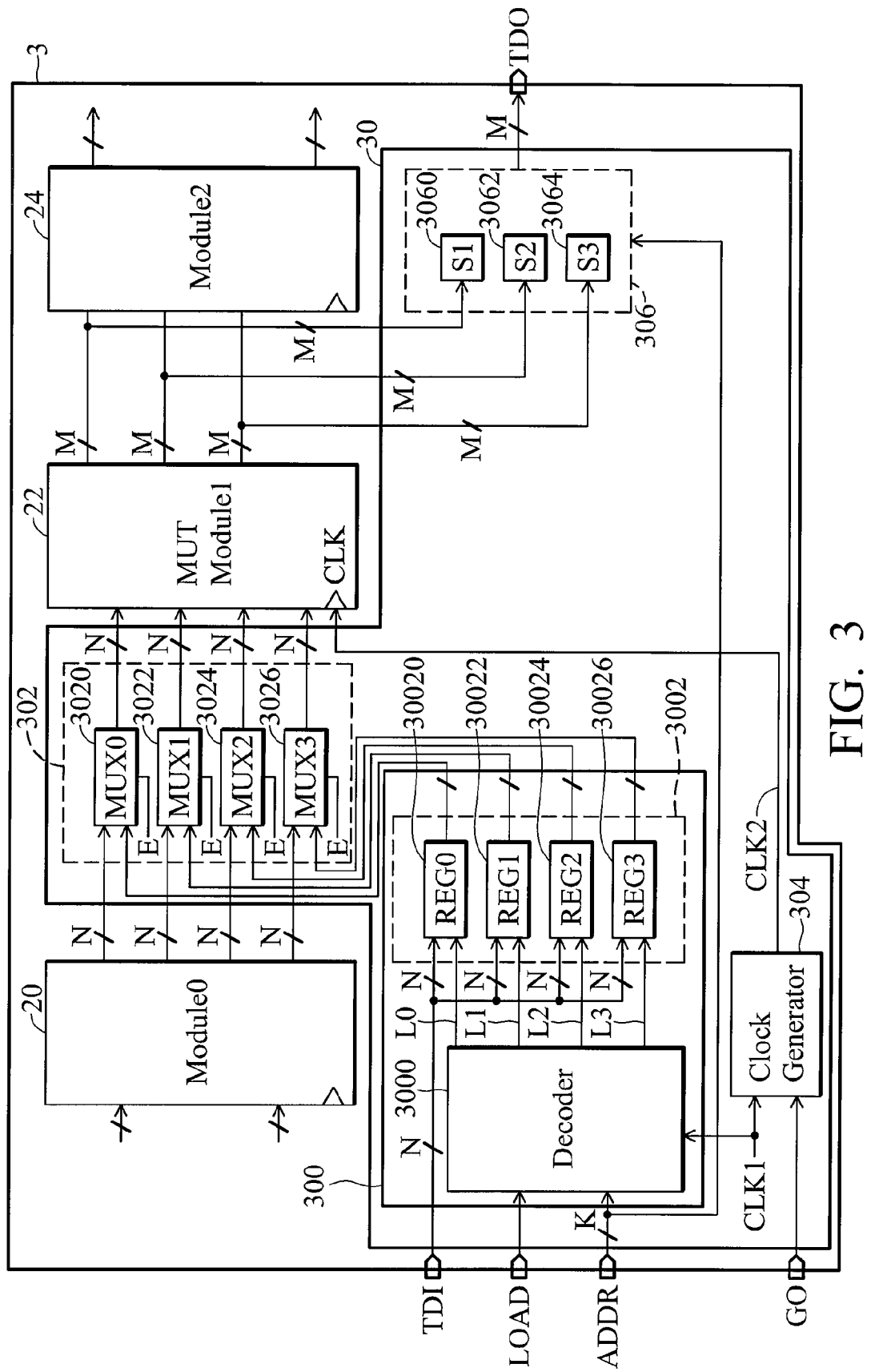
FIG. 3 schematically shows an embodiment of a test circuit according to the invention.

FIG. 3 schematically shows a test circuit 30 according to an embodiment of the invention. As shown, the test circuit 30 includes a storage device 300, a multiplexing module 302 and a clock generator 304. The storage device 300 includes a decoder 3000 and a register module 3002. The decoder 3000 is coupled to the register module 3002 and the multiplexing module 302. The decoder 3000 provides enabling signals for the register module 3002 according to a loading signal LOAD and an address selection signal ADDR. As shown in FIG. 3, the decoder generates one of enabling signals L0, L1, L2 or L3 to the register module 3002 when the loading signal LOAD goes high. A clock signal CLK1 generates a clock used for internal modules. The register module 3002 includes a plurality of registers, the number of which is dependent upon the input pins of the testing module MUT. The registers in the register module 3002 also store the test pattern according to the enabling signal generated from the decoder 3000. The multiplexing module 302 includes a plurality of multiplexers as much as the number of the registers in the register module 3002. The multiplexing module 302 has one set of inputs connected to outputs of the previous module Module0, one set of inputs connected to outputs of the register module 3002 and control terminals E to select one of the two set inputs for output to the testing module MUT. For example, the output is from outputs of the previous module Module0 when E is 0 and from outputs of the register module 3002 when E is 1. In operation, the control terminals E are controlled by a test mode signal TMODE (not shown) which indicates whether the chip is in test mode.

To achieve parallel input, the test pattern is divided into several N-bit groups and denoted as TDI[X] according to the number X, where X is related to the total bits J of the test pattern. For example, X is 4 when J is 16 and N is 4, and X is 5 when N is 4 and J is a number between 17 and 20. The registers in the register module 3002 are also divided into register groups according to the total bits J of the test pattern and the number of the test input pins N, such as, for example, groups REG0 30020, REG1 30022, REG2 30024, REG3 30026 as shown in FIG. 3. In this case, the storage device 300 stores these test data groups TDI[X]s separately according to the loading signal LOAD and the address selection signal ADDR. Each of the register groups receives and stores a test data group TDI[X] according to the corresponding enabling signal, and outputs the stored data to the multiplexing module 302. The multiplexers in the multiplexing module 302 are also divided into multiplexer groups as register groups of the register module 3002. For example, as shown in FIG. 3, the multiplexers in the multiplexing module 302 can be divided into four multiplexer groups MUX0 3020, MUX1 3022, MUX2 3024, and MUX3 3026.

Further, a test start signal GO is input to the clock generator 304 to generate a clock signal CLK2 to enable the test module MUT. It is to be understood that the test pattern, the loading signal LOAD, the address selection signal ADDR and the test start signal GO are signals input from external. Note that each registers in the register group can be controlled and selected to store one bit of the input pattern by the same enabling signal.

Figure 4:
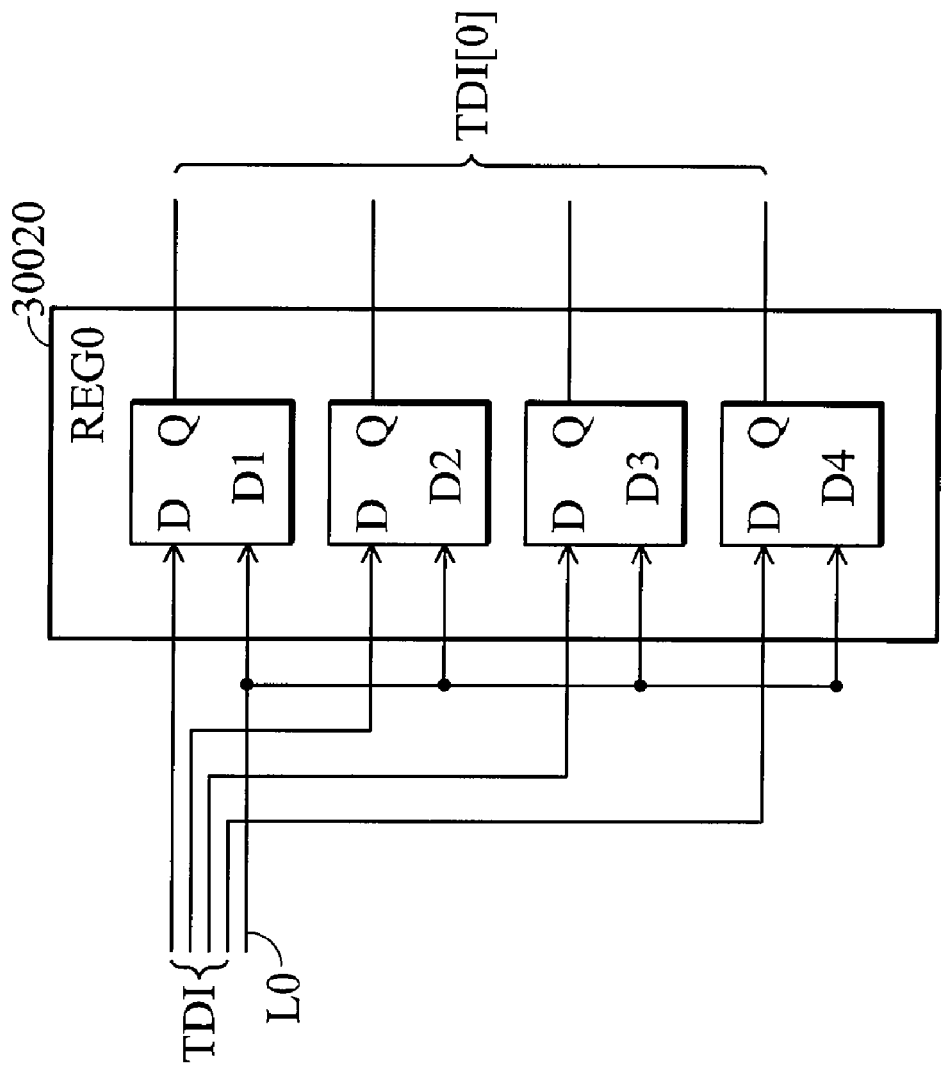
FIG. 4 shows an embodiment of a register module in FIG. 3 according to the invention.

FIG. 4 shows an embodiment of the register group REG0 30020 when N is 4 and J is 16. As shown, the register group REG0 includes four D-type flip flops D1~D4 each of which receives a bit of test pattern and an enabling signal and outputs the received test pattern to the multiplexing module 302. Each flip flop of the register group REG0 can be controlled and selected to store one bit of the input pattern by the same enabling signal L0. When the enabling signal L0 is asserted, each flip flop is selected and stores one bit of the input pattern. Thus, four bits of the test pattern are stored in the register group REG0. The outputs of the four flip flops are referred as TDI[0]. TDI[0] is then outputted to the corresponding input ports of the multiplexing module 302. Note that the D type flip-flop can also be used instead of a latch or other storing elements.

The register groups REG1, REG2 and REG3 of the FIG. 3 are set up in the same configuration as REG0, that is, REG1, REG2 and REG3 store the data groups of the test pattern TDI[1], TDI[2] and TDI[3] according to the enabling signal L1, L2 and L3 and are outputted to the corresponding input ports of the multiplexing module 302, respectively.

The test circuit 30 further includes a selection device 306 to select the output data groups of the test result outputted from the testing module MUT. As shown in FIG. 3, the selection device 306 includes three selectors S1 3060, S2 3062 and S3 3064 with multiple bits input and output, and each selector is connected to one of the output data groups of the test result.

For the purpose of parallel output, the test result is divided into several M-bit groups and denoted as TDO[Y] according to the number of the test output pins M where Y is related to the total bits L of the test result. For example, Y is 3 when L is 9 and M is 3, and Y is 4 when M is 3 and L is a number between 10 and 12. The number of the input and output bits for the selector depend on the number of the output pins TDO. For example, as shown in FIG. 3, the selectors S1, S2 and S3 are connected to the output data groups TDO[0], TDO[1] and TDO[2] respectively.

FIG. 5 shows an example of a test pattern. Test pattern is a predefined profile that includes a portion of test data input and a portion of expected test data out according to the inputted data. As shown, the test data input has sixteen bits and the expected test data out has twelve bits only. For example, when the testing module receives test data input "0001111110001100" at cycle 0, it should output "101011000011". If an unexpected output occurs, the testing module is abnormal. The sixteen bits of the test data are divided into four groups TDI[0]-TDI[3], and also the test result out, denoted as TDO[X], is divided into three groups TDO[0]-TDO[2]. For example, the test data input "0001111110001100" at cycle 0 is divided in the way that "0001" as data group TDI[0], "1111" as data group TDI[1], "1000" as data group TDI[2] and "1100" as data group TDI[3]. These data groups are then output and stored to one of the register groups REG0-REG3 depending on the enabling signal L0-L3.

Operation of the test circuit 30 shown in FIG. 3 is described as follows with reference to FIGS. 6 and 7.

Figure 6:
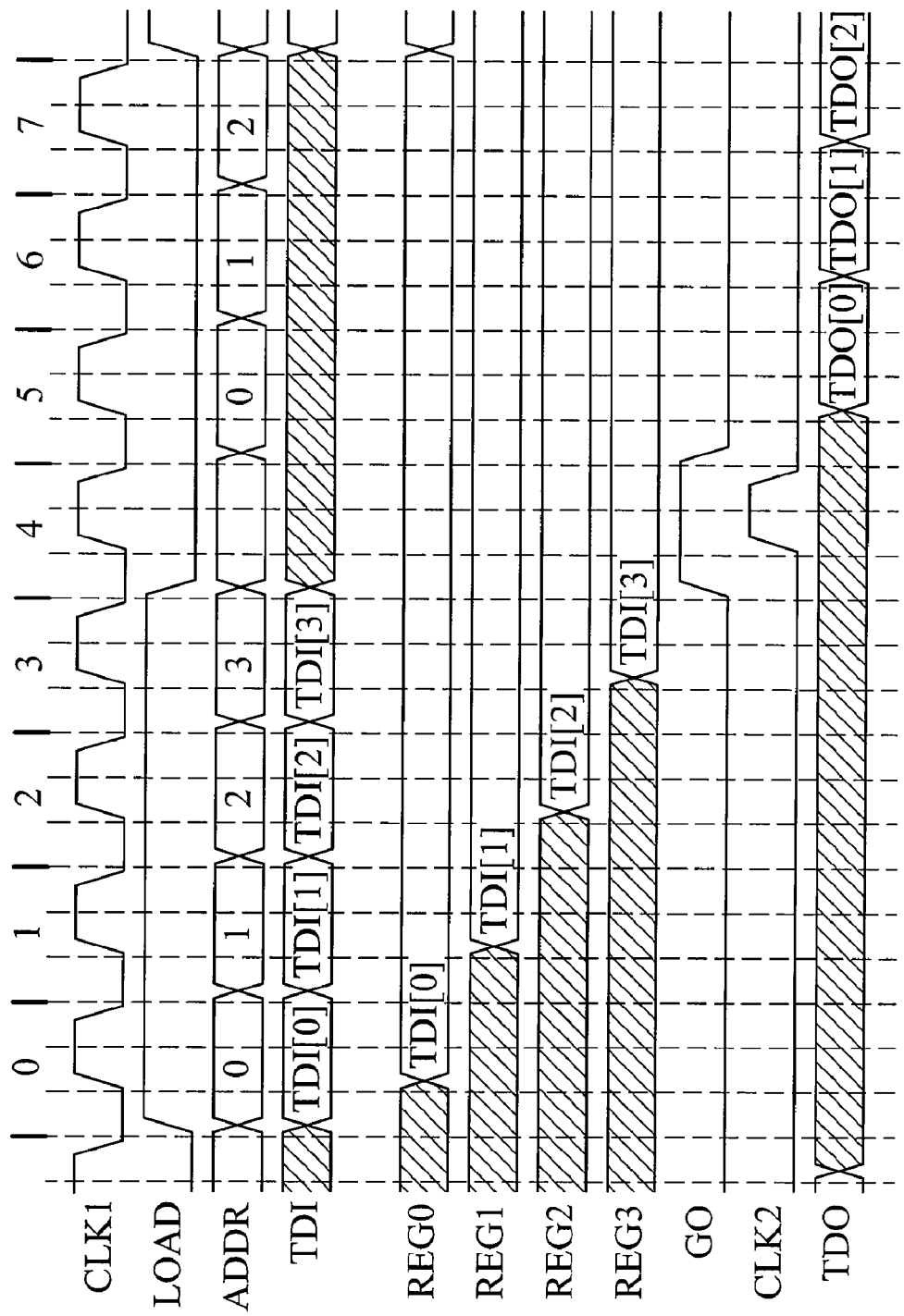
FIG. 6 is a timing chart of the circuit shown in FIG. 3.
Figure 7:
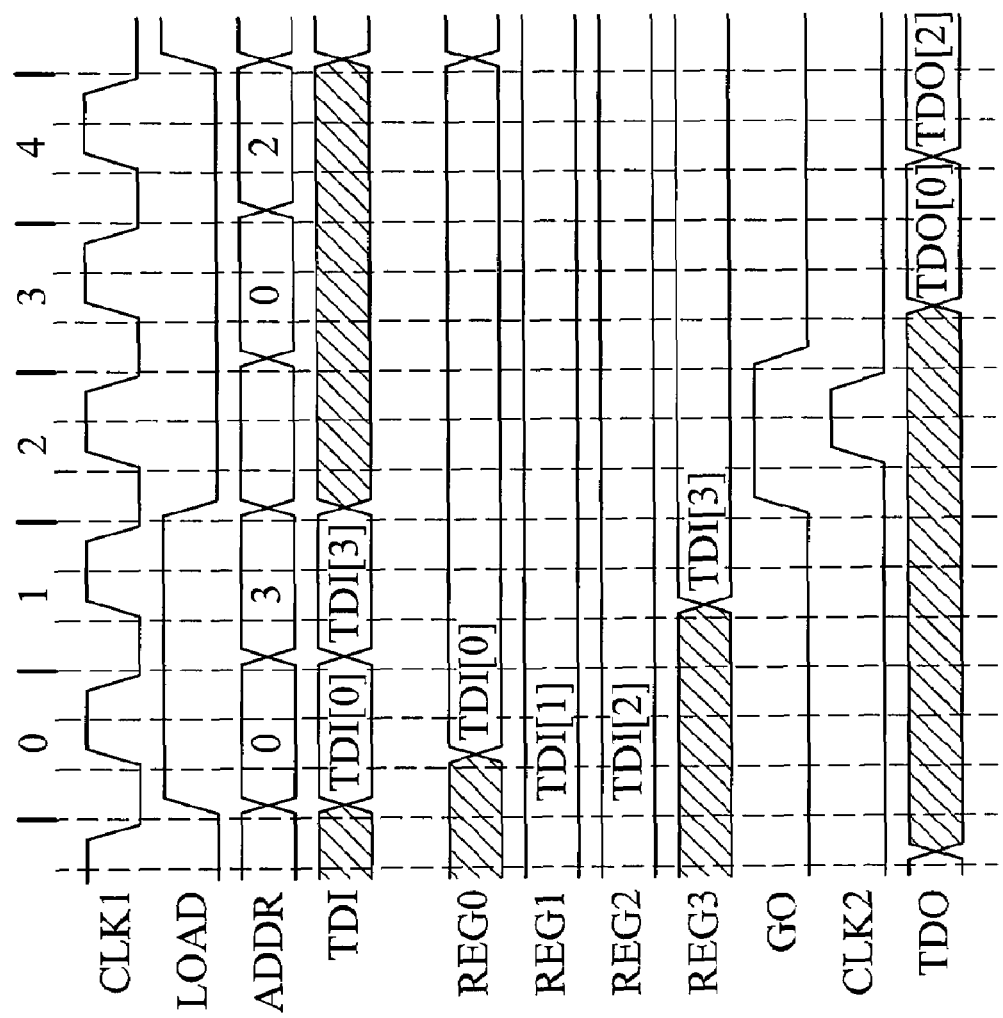
FIG. 7 is another timing chart of the circuit shown in FIG. 3.

FIG. 6 is a timing chart of the chip with the test circuit 30 shown in FIG. 3. In this embodiment, the length of test pattern is J bits, the length of the test data input is N bits and the length of test result output is M bits. Test mode signal TMODE will go high while entering the test mode. As shown, the loading signal LOAD remains high during period cycles 0-3 and goes low during period cycles 4-7. The period cycle in which the loading signal LOAD goes high is referred to as the load cycle while the period cycle that the loading signal LOAD goes low is referred to as the observe cycle.

At cycle 0, the loading signal LOAD goes high and the address selection signal ADDR is "0" such that the decoder 3000 generates the enabling signal L0 to the register module 3002 and the test data group to be inputted via the test pins TDI is TDI[0]. The enabling signal L0 enables the corresponding register group REG0 in the register module 3002 and, thus, the $1^{st}$ data group TDI[0] is stored in the register group REG0.

At cycle 1, the loading signal LOAD remains high and the address selection signal ADDR is changed to "1" such that the decoder 3000 generates the enabling signal L1 to the register module 3002 and the test data group to be inputted via the test pins TDI is TDI[1]. The enabling signal L1 enables the corresponding register group REG1 in the register module 3002 and, thus, the $2^{nd}$ data group TDI[1] is stored in the register group REG1.

At cycle 2, the loading signal LOAD remains high and the address selection signal ADDR is changed to "2" such that the decoder 3000 generates the enabling signal L2 to the register module 3002 and the test data group to be inputted via the test pins TDI is TDI[2]. At cycle 3, the loading signal LOAD remains high and the address selection signal ADDR is changed to "3" such that the decoder 3000 generates the enabling signal L3 to the register module 3002 and the test data group to be input via the test pins TDI is TDI[3]. Similarly, the data groups TDI[2] and TDI[3] are also stored in the corresponding register group REG2 and REG3 respectively, according to the enabling signals L2 and L3.

After these loading cycles, sixteen bits of the test data are stored into register groups REG0-REG3 and the test start signal GO remains low. Moreover, the test mode signal TMODE is high, as is the control terminal E, such that the data groups TDI[0]-TDI[3] are sent to the testing module MUT via the corresponding multiplexer groups MUX0-MUX3, respectively.

At cycle 4, the test start signal GO becomes high such that the clock generator 340 generates a gated clock signal CLK2 to direct the testing module MUT to begin testing. Testing module MUT is tested and outputs nine bits of a test result in response to the input test data.

The sixteen bits of the input test pattern (data) can be loaded into the testing module at only four clock cycles, compared to the conventional testing method with boundary scan's required sixteen clock cycles, at about one fourth testing time. The invention thus saves not only testing time and improves the performance.

Moreover, the output of the nine bits of the test result can also be observed and verified in parallel, conserving verification time. The nine bits are divided into three output data groups TDO[0]-TDO[2], of which each output data group has three bits. The output data groups TDO[0]-TDO[2] are sent to the selector S1-S3, respectively. In addition, the same address selection signal ADDR is used to select the observed and verified output data group.

During cycle 5 to cycle 7, the test result is observed and verified in the test data output pins TDO. At cycle 5, the loading signal LOAD goes low and the address selection signal ADDR is changed to "0" such that the selection device 350 selects the selector S1 as the input module and thus the $1^{st}$ output data group TDO[0] is sent to the test data output pins TDO for observing and verifying. At cycle 6, the loading signal LOAD goes low and the address selection signal ADDR is changed to "1" such that the selection device 306 selects the selector S2 to be the input module and thus the $2^{nd}$ output data group TDO[1] is sent to the test data output pins TDO for observing and verifying. Similarly, the selection device 306 selects the selector S3 to be the input module and thus the $3^{rd}$ output data group TDO[2] is sent to the test data output pins TDO at cycle 7.

The nine bits of the test result can be observed and verified at only three clock cycles, compared to the conventional testing method with boundary scan's required nine clock cycles, at about one third testing time. The invention thus saves testing time and improves the performance.

Further, because the profile of the test patterns is predefined, testing and verifying time are significant reduced by no need to load or verify the data groups when the input data groups and the expected output data groups of the test pattern remain the same in continuous testing cycles. FIG. 7 is another timing chart of the chip with test circuit 30 shown in FIG. 3. For example, referring to both FIG. 5 and FIG. 7, the input data groups TDI[1] and TDI[2] at cycle 0 and 1 are not changed. Therefore, only the changed input data groups TDI[0] and TDI[3] require loading while testing at cycle 0 and 1. Alternately, when output data groups TDO[1] at cycle 0 and 1 is not changed, only the output data groups TDO[0] and TDO[2] require verifying. In other words, both the input data groups to be loaded and the output data groups to be verified are selectively loaded and verified. By doing so, the clock cycles need for loading the test pattern and verifying the test result can be further reduced.

Figure 8:
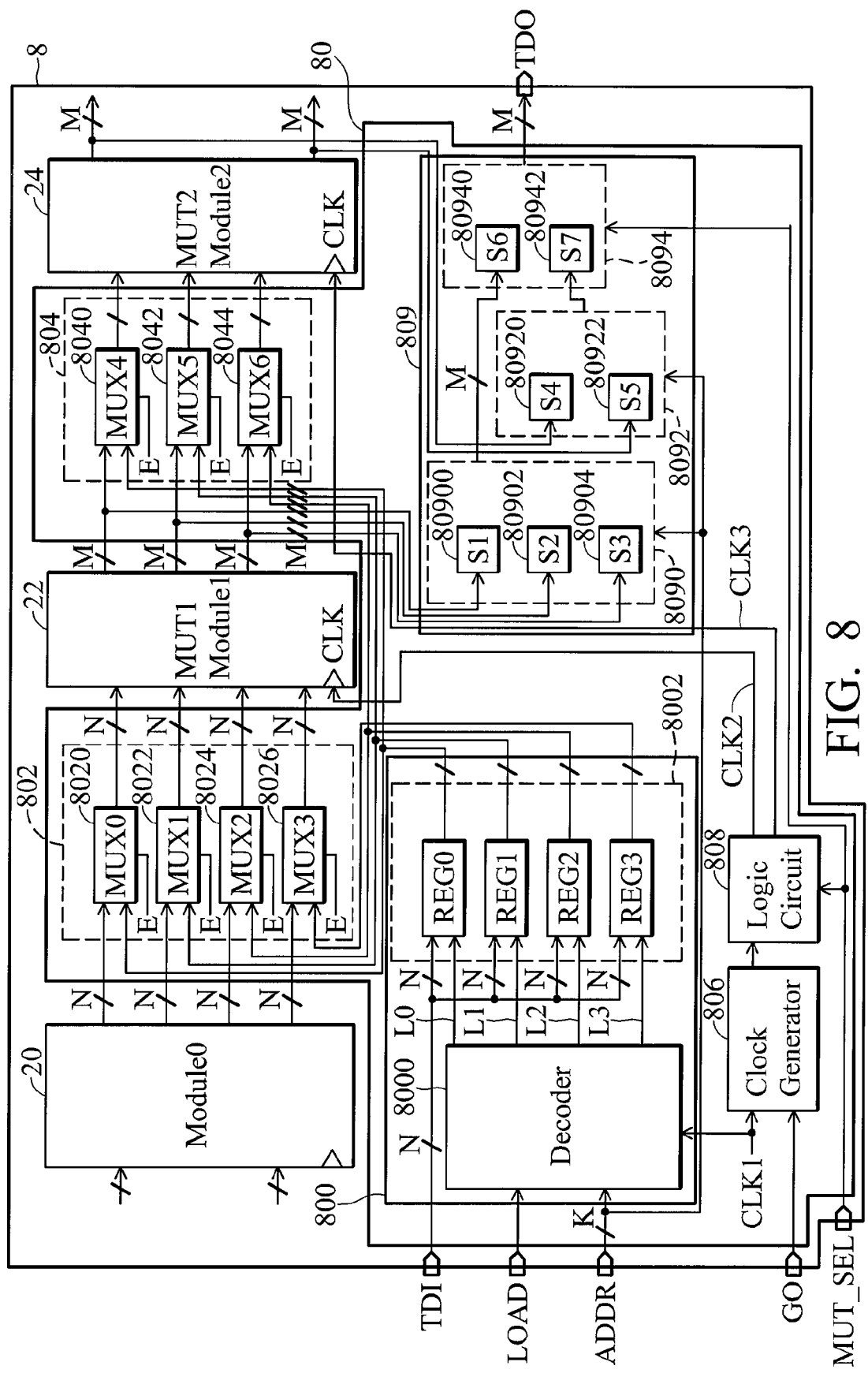
FIG. 8 schematically shows another embodiment of the test circuit according to the invention.

FIG. 8 schematically shows another embodiment of a chip comprising a test circuit 80 according to the invention. The chip has at least two testing modules MUT1 and MUT2, tested in different cycles. As shown, the configuration of the test circuit 80 is similar to the circuit 30 shown in FIG. 3 except that logic circuit 808, a second selection module and a third selection module 8092, 8094, a second multiplexing module 804 and a module selection signal MUT_SEL are added to test and verify the testing modules. In this embodiment, the second selection module and the third selection module 8092, 8094 and selection device 8090 form a new selection device 809.

The second multiplexing module 804 includes a plurality of multiplexers divided into three multiplexer groups MUX4 8040, MUX5 8042 and MUX6 8044. The second multiplexing module 804 has one set of inputs connected to outputs of the testing module MUT2, one set of inputs connected to outputs of the register module 8002 and control terminals E to select one of the two set inputs for outputting to the testing module MUT2 according the test mode signal TMODE. The operation of the multiplexing module 804 is similar to the multiplexing module 302 in FIG. 3, and thus is omitted for simplification.

The logic unit 808 includes logic gates, such as AND/NAND gates, NOR gates or combinations thereof and several multiplexers to select and generate clock signals CLK2 and CLK3 for testing module MUT1 and MUT2 respectively, according to the outputs of the clock generator 806 and the module selection signal MUT_SEL. For example, the testing module is MUT1 when MUT_SEL is 0 and clock signal CLK2 will be sent to testing module MUT1 to direct the MUT1 to begin testing. Alternatively, the testing module is MUT2 when MUT_SEL is 1 and clock signal CLK3 will be sent to testing module MUT2 to direct the MUT2 to begin testing.

As shown in FIG. 8, for example, the selection module 8092 includes two selectors S4 and S5 while the selection module 8094 includes two selectors S6 and S7. The outputs of the selection device 8090 is connected to the selector S6 of the selection module 8094 and sent thereto. The outputs of the testing module MUT2 is connected to the selection module 8092 which outputs further connected to the selector S7 of the selection module 8094 and sent thereto. The data groups of the testing module are outputted to test data output pins TDO according to the module selection signal MUT_SEL. For example, the TDO is from testing module MUT1 when the module selection signal MUT_SEL is 0 and from testing module MUT2 when the module selection signal MUT_SEL is 1.

The operation of the circuit 80 in FIG. 8 is similar to the circuit 30 in FIG. 3, and thus, is omitted for simplification.

The test circuit 80 as shown in FIG. 8 can testing a chip comprising more than one testing module. It is to be noted that some components of the test circuit 80 of the invention can be shared while the modules are testing in different cycles. For example, both the storage of test data input register module and the decoder could be shared even when the number of testing modules changes. Thus, the test circuit can be easily applied to a variety of chips.

The invention also provides a method for testing digital logic circuit modules of an integrated circuit chip. The method includes the following steps. A first N-bit group, a second N-bit group, a third N-bit group and a fourth N-bit group of a test pattern are stored separately according to a loading signal and an address selection signal. Next, the first N-bit group, the second N-bit group, the third N-bit group and the fourth N-bit group which will be received and executed to parallel generate a first M-bit group, a second M-bit group and a third M-bit group are parallel transmitted. And then, one of the first M-bit group, the second M-bit group and the third M-bit group are sequentially selected to output a first test result according to the address selection signal. Each one of the first N-bit group, the second N-bit group, the third N-bit group and the fourth N-bit group of the test pattern has N bits and each one of the first M-bit group, the second M-bit group and the third M-bit group has M bits.

The method further includes the following steps. A first enabling signal, a second enabling signal, a third enabling signal and a fourth enabling signal are separately generated in response to the loading signal and the address selection signal, storing the first N-bit group, the second N-bit group, the third N-bit group and the fourth N-bit group are separately stored corresponding to the first enabling signal, the second enabling signal, the third enabling signal and the fourth enabling signal respectively.

The first value, the second value, the third value and the fourth value of data of the address selection signal are decoded to generate the first, second, third and fourth enabling signals corresponding to a first address, a second address, a third address and a fourth address. The first value of data of the address selection signal is 0 if value of the first address is 0, the second value of data of the address selection signal is 1 if value of the second address is 1, the third value of data of the address selection signal is 2 if value of the third address is 2 and the fourth value of data of the address selection signal is 3 if value of the fourth address is 3. The first enabling signal is sent to store the first N-bit group if value of the first address is 0, the second enabling signal is sent to store the second N-bit group if value of the second address is 1, the third enabling signal is sent to store the third N-bit group if value of the third address is 2 and the fourth enabling signal is sent to store the forth N-bit group if value of the fourth address is 3.

The first enabling signal is sent to store the first N-bit group if value of the first address is 0, the second enabling signal is sent to store the second N-bit group if value of the second address is 1, the third enabling signal is sent to store the third N-bit group if value of the third address is 2 and the fourth enabling signal is sent to store the forth N-bit group if value of the fourth address is 3.

The method further includes the following steps. The first N-bit group, the second N-bit group, the third N-bit group and the fourth N-bit group when the integrated circuit chip is in a test mode. And then, the first M-bit group, the second M-bit group, and the third M-bit group that will be received and executed to parallel generate a next first M-bit group and a next second M-bit group.

Moreover, the method also includes the following steps. The first M-bit group, the second M-bit group and the third M-bit group are transmitted when the integrated circuit chip is in a test mode. Next, one of the first M-bit group, the second M-bit group and the third M-bit group are sequentially outputted to generate the first test result according to the address selection signal, one of the next first M-bit group and the next second M-bit group are sequentially outputted to generate a second test result according to the address selection signal, and selecting one of the first test result and the second test result are selected to output a final test result according to a module selection signal.

The first M-bit group is selected when a first value of data of the selection signal is 0, the second M-bit group is selected when a second value of data of the selection signal is 1 and the third M-bit group is selected when a third value of data of the selection signal is 2. The next first M-bit group is selected when a first value of data of the selection signal is 0 and the next second M-bit group is selected when a second value of data of the selection signal is 1.

The first test result is selected when a first value of data of the module selection signal is 0 or the second test result is selected when a second value of data of the module selection signal is 1.

Besides, the method includes the following steps. A next first N-bit group, a next second N-bit group, a next third N-bit group and a next fourth N-bit group of a next test pattern are provided after the first test result is outputted, the next first N-bit group, the next second N-bit group, the next third N-bit group and the next fourth N-bit group with the first N-bit group, the second N-bit group, the third N-bit group and the fourth N-bit group respectively in order to generate a comparing result, and a set of the next first N-bit group, a next second N-bit group, a next third N-bit group and a next fourth N-bit group are inputted according to the comparing result.

Therefore, the set of the next first N-bit group, the next second N-bit group, the next third N-bit group and the next fourth N-bit group are selected to input if the comparing result shows that a corresponding one of the next first N-bit group, the next second N-bit group, the next third N-bit group and the next fourth N-bit group is different to a corresponding one of the first N-bit group, the second N-bit group, the third. N-bit group and the fourth N-bit group.

It is to be noted that the bit number of the test pattern, the number of the test data input pins TDI, the number of the test data output pins TDO and the number of the registers and multiplexers and selectors used are only examples, and the invention is not limited thereto.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A circuit for testing digital logic circuit modules of an integrated circuit chip, the circuit comprising:

a storage device for storing a first N-bit group, a second N-bit group, a third N-bit group and a fourth N-bit group of a test pattern separately according to a loading signal and an address selection signal;

a first multiplexing module coupled to the storage device and a first digital logic circuit module, for parallel transmitting the first N-bit group, the second N-bit group, the third N-bit group and the fourth N-bit group which will be received and executed by the first digital logic circuit module to parallel generate a first M-bit group, a second M-bit group and a third M-bit group; and a selection device coupled to the first digital logic circuit module for sequentially selecting one of the first M-bit group, the second M-bit group and the third M-bit group to output a first test result according to the address selection signal;

wherein each one of the first N-bit group, the second N-bit group, the third N-bit group and the fourth N-bit group of the test pattern has N bits and each one of the first M-bit group, the second M-bit group and the third M-bit group has M bits.

2. The circuit as claimed in claim 1, wherein the storage device comprises:

a decoder for generating a first enabling signal, a second enabling signal, a third enabling signal and a fourth enabling signal separately in response to the loading signal and the address selection signal;

a first register, which has N parallel flip-flops, for storing the first N-bit group according to the first enabling signal;

a second register, which has N parallel flip-flops, for storing the second N-bit group according to the second enabling signal;

a third register, which has N parallel flip-flops, for storing the third N-bit group according to the third enabling signal; and a fourth register, which has N parallel flip-flops, for storing the fourth N-bit group according to the fourth enabling signal.

3. The circuit as claimed in claim 2, wherein the decoder decodes a first value, a second value, a third value and a fourth value of data of the address selection signal to generate the first enabling signal, the second enabling signal, the third enabling signal and the fourth enabling signal, to the first register, the second register, the third register and the fourth register respectively, corresponding to a first address, a second address, a third address and a fourth address of the first register, the second register, the third register and the fourth register.

4. The circuit as claimed in claim 3, wherein the first value of data of the address selection signal is 0 if value of the first address of the first register is 0, the second value of data of the address selection signal is 1 if value of the second address of the second register is 1, the third value of data of the address selection signal is 2 if value of the third address of the third register is 2 and the fourth value of data of the address selection signal is 3 if value of the fourth address of the fourth register is 3.

5. The circuit as claimed in claim 3, wherein the first enabling signal is sent to the first register if value of the first address of the first register is 0, the second enabling signal is sent to the second register if value of the second address of the second register is 1, the third enabling signal is sent to the third register if value of the third address of the third register is 2 and the fourth enabling signal is sent to the fourth register if value of the fourth address of the fourth register is 3.

6. The circuit as claimed in claim 3, wherein the first N-bit group is stored into the first register if value of the first address of the first register is 0, the second N-bit group is stored into the second register if value of the second address of the second register is 1, the third N-bit group is stored into the third register if value of the third address of the third register is 2 and the fourth N-bit group is stored into the fourth register if value of the fourth address of the fourth register is 3.

7. The circuit as claimed in claim 1, wherein the first multiplexing module comprises:

a first group of multiplexers, which has N parallel multiplexers, for transmitting the first N-bit group when the integrated circuit chip is in a test mode;

a second group of multiplexers, which has N parallel multiplexers, for transmitting the second N-bit group when the integrated circuit chip is in the test mode;

a third group of multiplexers, which has N parallel multiplexers, for transmitting the third N-bit group when the integrated circuit chip is in the test mode; and a fourth group of multiplexers, which has N parallel multiplexers, for transmitting the fourth N-bit group when the integrated circuit chip is in the test mode.

8. The circuit as claimed in claim 1, wherein the circuit further comprises a second multiplexing module coupled to the storage device, the first digital logic circuit module, a second logic circuit module and the selection device, for parallel transmitting the first, second, and third M-bit groups which will be received and executed by the second digital logic circuit module to parallel generate a next first and second M-bit groups.

9. The circuit as claimed in claim 8, wherein the second multiplexing module comprises:

a first group of multiplexers, which has M parallel multiplexers, for transmitting the first M-bit group when the integrated circuit chip is in a test mode;

a second group of multiplexers, which has M parallel multiplexers, for transmitting the second M-bit group when the integrated circuit chip is in the test mode; and a third group of multiplexers, which has M parallel multiplexers, for transmitting the third M-bit group when the integrated circuit chip is in the test mode.

10. The circuit as claimed in claim 8, wherein the selection device comprises:

a first selection module for sequentially outputting one of the first M-bit group, the second M-bit group and the third M-bit group to generate the first test result according to the address selection signal;

a second selection module for sequentially outputting one of the next first M-bit group and the next second M-bit group, from the second digital logic circuit module, to generate a second test result according to the address selection signal; and a third selection module for selecting one of the first and second test results to output a final test result according to a module selection signal.

11. The circuit as claimed in claim 10, wherein the first selection module selects the first M-bit group when a first value of data of the address selection signal is 0, the second M-bit group when a second value of data of the address selection signal is 1 and the third M-bit group when a third value of data of the address selection signal is 2.

12. The circuit as claimed in claim 10, wherein the second selection module selects the next first M-bit group when a first value of data of the address selection signal is 0 and the next second M-bit group when a second value of data of the address selection signal is 1.

13. The circuit as claimed in claim 10, wherein the third selection module selects the first test result when a first value of data of the module selection signal is 0 or the second test result when a second value of data of the module selection signal is 1.

14. A method for testing digital logic circuit modules of an integrated circuit chip, the method comprising:
   storing a first N-bit group, a second N-bit group, a third N-bit group and a fourth N-bit group of a test pattern separately according to a loading signal and an address selection signal;
   parallel transmitting the first N-bit group, the second N-bit group, the third N-bit group and the fourth N-bit group which will be received and executed to parallel generate a first M-bit group, a second M-bit group and a third M-bit group; and
   sequentially selecting one of the first M-bit group, the second M-bit group and the third M-bit group to output a first test result according to the address selection signal;
   wherein each one of the first N-bit group, the second N-bit group, the third N-bit group and the fourth N-bit group of the test pattern has N bits and each one of the first M-bit group, the second M-bit group and the third M-bit group has M bits,
   wherein a first value, a second value, a third value and a fourth value of data of the address selection signal are decoded to generate a first enabling signal, a second enabling signal, a third enabling signal and a fourth enabling signal corresponding to a first address, a second address, a third address and a fourth address.

15. The method as claimed in claim 14, wherein the method further comprises:
   generating the first enabling signal, the second enabling signal, the third enabling signal and the fourth enabling signal separately in response to the loading signal and the first value, the second value, the third value and the fourth value of data of the address selection signal;
   storing the first N-bit group, the second N-bit group, the third N-bit group and the fourth N-bit group separately corresponding to the first enabling signal, the second enabling signal, the third enabling signal and the fourth enabling signal respectively.

16. The method as claimed in claim 14, wherein the first value of data of the address selection signal is 0 if value of the first address is 0, the second value of data of the address selection signal is 1 if value of the second address is 1, the third value of data of the address selection signal is 2 if value of the third address is 2 and the fourth value of data of the address selection signal is 3 if value of the fourth address is 3.

17. The method as claimed in claim 14, wherein the first enabling signal is sent to store the first N-bit group if value of the first address is 0, the second enabling signal is sent to store the second N-bit group if value of the second address is 1, the third enabling signal is sent to store the third N-bit group if value of the third address is 2 and the fourth enabling signal is sent to store the forth N-bit group if value of the fourth address is 3.

18. The method as claimed in claim 14, wherein the method further comprises parallel transmitting the first N-bit group, the second N-bit group, the third N-bit group and the fourth N-bit group when the integrated circuit chip is in a test mode.

19. The method as claimed in claim 18, wherein the method further comprises parallel transmitting the first M-bit group, the second M-bit group, and the third M-bit group which will be received and executed to parallel generate a next first M-bit group and a next second M-bit group.

20. The method as claimed in claim 18, wherein the method further comprises transmitting the first M-bit group, the second M-bit group and the third M-bit group when the integrated circuit chip is in a test mode.

21. The method as claimed in claim 19, wherein the method further comprises:
   sequentially outputting one of the first M-bit group, the second M-bit group and the third M-bit group to generate the first test result according to the address selection signal;
   sequentially outputting one of the next first M-bit group and the next second M-bit group to generate a second test result according to the address selection signal; and
   selecting one of the first test result and the second test result to output a final test result according to a module selection signal.

22. The method as claimed in claim 21, wherein the first M-bit group is selected when a first value of data of the address selection signal is 0, the second M-bit group is selected when a second value of data of the address selection signal is 1 and the third M-bit group is selected when a third value of data of the address selection signal is 2.

23. The method as claimed in claim 21, wherein the next first M-bit group is selected when a first value of data of the address selection signal is 0 and the next second M-bit group is selected when a second value of data of the address selection signal is 1.

24. The method as claimed in claim 21, wherein the first test result is selected when a first value of data of the module selection signal is 0 or the second test result is selected when a second value of data of the module selection signal is 1.

25. The method as claimed in claim 14, furthering comprising:
   providing a next first N-bit group, a next second N-bit group, a next third N-bit group and a next fourth N-bit group of a next test pattern after outputting the first test result;
   comparing the next first N-bit group, the next second N-bit group, the next third N-bit group and the next fourth N-bit group with the first N-bit group, the second N-bit group, the third N-bit group and the fourth N-bit group respectively to generate a comparing result; and
   inputting a set of the next first N-bit group, the next second N-bit group, the next third N-bit group and the next fourth N-bit group according to the comparing result.

26. The method as claimed in claim 25, wherein selecting the set of the next first N-bit group, the next second N-bit group, the next third N-bit group and the next fourth N-bit group to input if the comparing result shows that a corresponding one of the next first N-bit group, the next second N-bit group, the next third N-bit group and the next fourth N-bit group is different to a corresponding one of the first N-bit group, the second N-bit group, the third N-bit group and the fourth N-bit group.

* * * * *